United States Patent
Diao et al.

(10) Patent No.: US 9,042,057 B1
(45) Date of Patent: May 26, 2015

(54) METHODS FOR PROVIDING MAGNETIC STORAGE ELEMENTS WITH HIGH MAGNETO-RESISTANCE USING HEUSLER ALLOYS

(71) Applicant: Western Digital (Fremont), LLC, Fremont, CA (US)

(72) Inventors: Zhitao Diao, Fremont, CA (US); Qunwen Leng, Palo Alto, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 14/290,961

(22) Filed: May 29, 2014

Related U.S. Application Data (62) Division of application No. 13/737,374, filed on Jan. 9, 2013, now Pat. No. 8,760,818.

(51) Int. Cl.
    *G11B 5/31* (2006.01)

(52) U.S. Cl.
    CPC ............. *G11B 5/3143* (2013.01); *G11B 5/313* (2013.01)

(58) Field of Classification Search
    USPC ........................................................ 360/313
    See application file for complete search history.

(56) References Cited

U.S. PATENT DOCUMENTS

| | | | |
|---|---|---|---|
| 4,828,966 A | 5/1989 | Mallary et al. | |
| 6,016,290 A | 1/2000 | Chen et al. | |
| 6,018,441 A | 1/2000 | Wu et al. | |
| 6,025,978 A | 2/2000 | Hoshi et al. | |
| 6,025,988 A | 2/2000 | Yan | |
| 6,032,353 A | 3/2000 | Hiner et al. | |
| 6,033,532 A | 3/2000 | Minami | |
| 6,034,851 A | 3/2000 | Zarouri et al. | |
| 6,043,959 A | 3/2000 | Crue et al. | |
| 6,046,885 A | 4/2000 | Aimonetti et al. | |
| 6,049,650 A | 4/2000 | Jerman et al. | |
| 6,055,138 A | 4/2000 | Shi | |
| 6,058,094 A | 5/2000 | Davis et al. | |
| 6,073,338 A | 6/2000 | Liu et al. | |
| 6,078,479 A | 6/2000 | Nepela et al. | |
| 6,081,499 A | 6/2000 | Berger et al. | |
| 6,094,803 A | 8/2000 | Carlson et al. | |
| 6,099,362 A | 8/2000 | Viches et al. | |
| 6,103,073 A | 8/2000 | Thayamballi | |
| 6,108,166 A | 8/2000 | Lederman | |

(Continued)

FOREIGN PATENT DOCUMENTS

| | | |
|---|---|---|
| JP | 2004-146480 A | 5/2004 |
| JP | 2005-116703 A | 4/2005 |

OTHER PUBLICATIONS

J.R. Childress, et al., "All Metal Current-Perpendicular-to-Plane Giant Magnetoresistance Sensors for Narrow-Track Magnetic Recording", IEEE Transactions on Magnetics, Vol. 44, No. 1, Jan. 2008, pp. 90-94.

(Continued)

*Primary Examiner* — Mohammad Ghayour
*Assistant Examiner* — Mark Blouin (57) ABSTRACT

Methods for providing magnetic storage elements with high magneto-resistance using Heusler alloys are provided. One such method includes depositing a substrate including NiFe, depositing a seed layer on the substrate, depositing a buffer layer on the seed layer, and growing, epitaxially, an upper layer on the buffer layer, the upper layer including a Heusler alloy.

15 Claims, 4 Drawing Sheets

(56) References Cited

U.S. PATENT DOCUMENTS

| | | |
|---|---|---|
| 6,118,629 A | 9/2000 | Huai et al. |
| 6,118,638 A | 9/2000 | Knapp et al. |
| 6,125,018 A | 9/2000 | Takagishi et al. |
| 6,130,779 A | 10/2000 | Carlson et al. |
| 6,134,089 A | 10/2000 | Barr et al. |
| 6,136,166 A | 10/2000 | Shen et al. |
| 6,137,661 A | 10/2000 | Shi et al. |
| 6,137,662 A | 10/2000 | Huai et al. |
| 6,160,684 A | 12/2000 | Heist et al. |
| 6,163,426 A | 12/2000 | Nepela et al. |
| 6,166,891 A | 12/2000 | Lederman et al. |
| 6,173,486 B1 | 1/2001 | Hsiao et al. |
| 6,175,476 B1 | 1/2001 | Huai et al. |
| 6,178,066 B1 | 1/2001 | Barr |
| 6,178,070 B1 | 1/2001 | Hong et al. |
| 6,178,150 B1 | 1/2001 | Davis |
| 6,181,485 B1 | 1/2001 | He |
| 6,181,525 B1 | 1/2001 | Carlson |
| 6,185,051 B1 | 2/2001 | Chen et al. |
| 6,185,077 B1 | 2/2001 | Tong et al. |
| 6,185,081 B1 | 2/2001 | Simion et al. |
| 6,188,549 B1 | 2/2001 | Wiitala |
| 6,190,764 B1 | 2/2001 | Shi et al. |
| 6,193,584 B1 | 2/2001 | Rudy et al. |
| 6,195,229 B1 | 2/2001 | Shen et al. |
| 6,198,608 B1 | 3/2001 | Hong et al. |
| 6,198,609 B1 | 3/2001 | Barr et al. |
| 6,201,673 B1 | 3/2001 | Rottmayer et al. |
| 6,204,998 B1 | 3/2001 | Katz |
| 6,204,999 B1 | 3/2001 | Crue et al. |
| 6,212,153 B1 | 4/2001 | Chen et al. |
| 6,215,625 B1 | 4/2001 | Carlson |
| 6,219,205 B1 | 4/2001 | Yuan et al. |
| 6,221,218 B1 | 4/2001 | Shi et al. |
| 6,222,707 B1 | 4/2001 | Huai et al. |
| 6,229,782 B1 | 5/2001 | Wang et al. |
| 6,230,959 B1 | 5/2001 | Heist et al. |
| 6,233,116 B1 | 5/2001 | Chen et al. |
| 6,233,125 B1 | 5/2001 | Knapp et al. |
| 6,237,215 B1 | 5/2001 | Hunsaker et al. |
| 6,252,743 B1 | 6/2001 | Bozorgi |
| 6,255,721 B1 | 7/2001 | Roberts |
| 6,258,468 B1 | 7/2001 | Mahvan et al. |
| 6,266,216 B1 | 7/2001 | Hikami et al. |
| 6,271,604 B1 | 8/2001 | Frank, Jr. et al. |
| 6,275,354 B1 | 8/2001 | Huai et al. |
| 6,277,505 B1 | 8/2001 | Shi et al. |
| 6,282,056 B1 | 8/2001 | Feng et al. |
| 6,296,955 B1 | 10/2001 | Hossain et al. |
| 6,297,955 B1 | 10/2001 | Frank, Jr. et al. |
| 6,304,414 B1 | 10/2001 | Crue, Jr. et al. |
| 6,307,715 B1 | 10/2001 | Berding et al. |
| 6,310,746 B1 | 10/2001 | Hawwa et al. |
| 6,310,750 B1 | 10/2001 | Hawwa et al. |
| 6,317,290 B1 | 11/2001 | Wang et al. |
| 6,317,297 B1 | 11/2001 | Tong et al. |
| 6,322,911 B1 | 11/2001 | Fukagawa et al. |
| 6,330,136 B1 | 12/2001 | Wang et al. |
| 6,330,137 B1 | 12/2001 | Knapp et al. |
| 6,333,830 B2 | 12/2001 | Rose et al. |
| 6,340,533 B1 | 1/2002 | Ueno et al. |
| 6,349,014 B1 | 2/2002 | Crue, Jr. et al. |
| 6,351,355 B1 | 2/2002 | Min et al. |
| 6,353,318 B1 | 3/2002 | Sin et al. |
| 6,353,511 B1 | 3/2002 | Shi et al. |
| 6,356,412 B1 | 3/2002 | Levi et al. |
| 6,359,779 B1 | 3/2002 | Frank, Jr. et al. |
| 6,369,983 B1 | 4/2002 | Hong |
| 6,375,761 B1 | 4/2002 | Gambino et al. |
| 6,376,964 B1 | 4/2002 | Young et al. |
| 6,377,535 B1 | 4/2002 | Chen et al. |
| 6,381,095 B1 | 4/2002 | Sin et al. |
| 6,381,105 B1 | 4/2002 | Huai et al. |
| 6,389,499 B1 | 5/2002 | Frank, Jr. et al. |
| 6,392,850 B1 | 5/2002 | Tong et al. |
| 6,396,660 B1 | 5/2002 | Jensen et al. |
| 6,399,179 B1 | 6/2002 | Hanrahan et al. |
| 6,400,526 B2 | 6/2002 | Crue, Jr. et al. |
| 6,404,600 B1 | 6/2002 | Hawwa et al. |
| 6,404,601 B1 | 6/2002 | Rottmayer et al. |
| 6,404,706 B1 | 6/2002 | Stovall et al. |
| 6,410,170 B1 | 6/2002 | Chen et al. |
| 6,411,522 B1 | 6/2002 | Frank, Jr. et al. |
| 6,417,998 B1 | 7/2002 | Crue, Jr. et al. |
| 6,417,999 B1 | 7/2002 | Knapp et al. |
| 6,418,000 B1 | 7/2002 | Gibbons et al. |
| 6,418,048 B1 | 7/2002 | Sin et al. |
| 6,421,211 B1 | 7/2002 | Hawwa et al. |
| 6,421,212 B1 | 7/2002 | Gibbons et al. |
| 6,424,505 B1 | 7/2002 | Lam et al. |
| 6,424,507 B1 | 7/2002 | Lederman et al. |
| 6,430,009 B1 | 8/2002 | Komaki et al. |
| 6,430,806 B1 | 8/2002 | Chen et al. |
| 6,433,965 B1 | 8/2002 | Gopinathan et al. |
| 6,433,968 B1 | 8/2002 | Shi et al. |
| 6,433,970 B1 | 8/2002 | Knapp et al. |
| 6,437,945 B1 | 8/2002 | Hawwa et al. |
| 6,445,536 B1 | 9/2002 | Rudy et al. |
| 6,445,542 B1 | 9/2002 | Levi et al. |
| 6,445,553 B2 | 9/2002 | Barr et al. |
| 6,445,554 B1 | 9/2002 | Dong et al. |
| 6,447,935 B1 | 9/2002 | Zhang et al. |
| 6,448,765 B1 | 9/2002 | Chen et al. |
| 6,451,514 B1 | 9/2002 | Iitsuka |
| 6,452,742 B1 | 9/2002 | Crue et al. |
| 6,452,765 B1 | 9/2002 | Mahvan et al. |
| 6,456,465 B1 | 9/2002 | Louis et al. |
| 6,459,552 B1 | 10/2002 | Liu et al. |
| 6,462,920 B1 | 10/2002 | Karimi |
| 6,466,401 B1 | 10/2002 | Hong et al. |
| 6,466,402 B1 | 10/2002 | Crue, Jr. et al. |
| 6,466,404 B1 | 10/2002 | Crue, Jr. et al. |
| 6,468,436 B1 | 10/2002 | Shi et al. |
| 6,469,877 B1 | 10/2002 | Knapp et al. |
| 6,477,019 B2 | 11/2002 | Matono et al. |
| 6,479,096 B1 | 11/2002 | Shi et al. |
| 6,483,662 B1 | 11/2002 | Thomas et al. |
| 6,487,040 B1 | 11/2002 | Hsiao et al. |
| 6,487,056 B1 | 11/2002 | Gibbons et al. |
| 6,490,125 B1 | 12/2002 | Barr |
| 6,496,330 B1 | 12/2002 | Crue, Jr. et al. |
| 6,496,334 B1 | 12/2002 | Pang et al. |
| 6,504,676 B1 | 1/2003 | Hiner et al. |
| 6,512,657 B2 | 1/2003 | Heist et al. |
| 6,512,659 B1 | 1/2003 | Hawwa et al. |
| 6,512,661 B1 | 1/2003 | Louis |
| 6,512,690 B1 | 1/2003 | Qi et al. |
| 6,515,573 B1 | 2/2003 | Dong et al. |
| 6,515,791 B1 | 2/2003 | Hawwa et al. |
| 6,532,823 B1 | 3/2003 | Knapp et al. |
| 6,535,363 B1 | 3/2003 | Hosomi et al. |
| 6,552,874 B1 | 4/2003 | Chen et al. |
| 6,552,928 B1 | 4/2003 | Qi et al. |
| 6,577,470 B1 | 6/2003 | Rumpler |
| 6,583,961 B2 | 6/2003 | Levi et al. |
| 6,583,968 B1 | 6/2003 | Scura et al. |
| 6,597,548 B1 | 7/2003 | Yamanaka et al. |
| 6,611,398 B1 | 8/2003 | Rumpler et al. |
| 6,618,223 B1 | 9/2003 | Chen et al. |
| 6,629,357 B1 | 10/2003 | Akoh |
| 6,633,464 B2 | 10/2003 | Lai et al. |
| 6,636,394 B1 | 10/2003 | Fukagawa et al. |
| 6,639,291 B1 | 10/2003 | Sin et al. |
| 6,650,503 B1 | 11/2003 | Chen et al. |
| 6,650,506 B1 | 11/2003 | Risse |
| 6,654,195 B1 | 11/2003 | Frank, Jr. et al. |
| 6,657,816 B1 | 12/2003 | Barr et al. |
| 6,661,621 B1 | 12/2003 | Iitsuka |
| 6,661,625 B1 | 12/2003 | Sin et al. |
| 6,674,610 B1 | 1/2004 | Thomas et al. |
| 6,680,863 B1 | 1/2004 | Shi et al. |
| 6,683,763 B1 | 1/2004 | Hiner et al. |
| 6,687,098 B1 | 2/2004 | Huai |
| 6,687,178 B1 | 2/2004 | Qi et al. |

(56) References Cited

U.S. PATENT DOCUMENTS

| | | |
|---|---|---|
| 6,687,977 B2 | 2/2004 | Knapp et al. |
| 6,691,226 B1 | 2/2004 | Frank, Jr. et al. |
| 6,697,294 B1 | 2/2004 | Qi et al. |
| 6,700,738 B1 | 3/2004 | Sin et al. |
| 6,700,759 B1 | 3/2004 | Knapp et al. |
| 6,704,158 B2 | 3/2004 | Hawwa et al. |
| 6,707,083 B1 | 3/2004 | Hiner et al. |
| 6,707,649 B2 | 3/2004 | Hasegawa et al. |
| 6,713,801 B1 | 3/2004 | Sin et al. |
| 6,721,138 B1 | 4/2004 | Chen et al. |
| 6,721,149 B1 | 4/2004 | Shi et al. |
| 6,721,203 B1 | 4/2004 | Qi et al. |
| 6,724,569 B1 | 4/2004 | Chen et al. |
| 6,724,572 B1 | 4/2004 | Stoev et al. |
| 6,729,015 B2 | 5/2004 | Matono et al. |
| 6,735,850 B1 | 5/2004 | Gibbons et al. |
| 6,737,281 B1 | 5/2004 | Dang et al. |
| 6,744,608 B1 | 6/2004 | Sin et al. |
| 6,747,301 B1 | 6/2004 | Hiner et al. |
| 6,751,055 B1 | 6/2004 | Alfoqaha et al. |
| 6,754,049 B1 | 6/2004 | Seagle et al. |
| 6,756,071 B1 | 6/2004 | Shi et al. |
| 6,757,140 B1 | 6/2004 | Hawwa |
| 6,760,196 B1 | 7/2004 | Niu et al. |
| 6,762,910 B1 | 7/2004 | Knapp et al. |
| 6,765,756 B1 | 7/2004 | Hong et al. |
| 6,775,902 B1 | 8/2004 | Huai et al. |
| 6,778,358 B1 | 8/2004 | Jiang et al. |
| 6,781,927 B1 | 8/2004 | Heanuc et al. |
| 6,785,955 B1 | 9/2004 | Chen et al. |
| 6,791,793 B1 | 9/2004 | Chen et al. |
| 6,791,807 B1 | 9/2004 | Hikami et al. |
| 6,798,616 B1 | 9/2004 | Seagle et al. |
| 6,798,625 B1 | 9/2004 | Ueno et al. |
| 6,801,408 B1 | 10/2004 | Chen et al. |
| 6,801,411 B1 | 10/2004 | Lederman et al. |
| 6,803,615 B1 | 10/2004 | Sin et al. |
| 6,806,035 B1 | 10/2004 | Atireklapvarodom et al. |
| 6,807,030 B1 | 10/2004 | Hawwa et al. |
| 6,807,332 B1 | 10/2004 | Hawwa |
| 6,809,899 B1 | 10/2004 | Chen et al. |
| 6,816,345 B1 | 11/2004 | Knapp et al. |
| 6,828,897 B1 | 12/2004 | Nepela |
| 6,829,160 B1 | 12/2004 | Qi et al. |
| 6,829,819 B1 | 12/2004 | Crue, Jr. et al. |
| 6,833,979 B1 | 12/2004 | Knapp et al. |
| 6,834,010 B1 | 12/2004 | Qi et al. |
| 6,859,343 B1 | 2/2005 | Alfoqaha et al. |
| 6,859,997 B1 | 3/2005 | Tong et al. |
| 6,861,937 B1 | 3/2005 | Feng et al. |
| 6,870,712 B2 | 3/2005 | Chen et al. |
| 6,873,494 B2 | 3/2005 | Chen et al. |
| 6,873,547 B1 | 3/2005 | Shi et al. |
| 6,879,464 B2 | 4/2005 | Sun et al. |
| 6,888,184 B1 | 5/2005 | Shi et al. |
| 6,888,704 B1 | 5/2005 | Diao et al. |
| 6,891,702 B1 | 5/2005 | Tang |
| 6,894,871 B2 | 5/2005 | Alfoqaha et al. |
| 6,894,877 B1 | 5/2005 | Crue, Jr. et al. |
| 6,906,894 B2 | 6/2005 | Chen et al. |
| 6,909,578 B1 | 6/2005 | Missell et al. |
| 6,912,106 B1 | 6/2005 | Chen et al. |
| 6,934,113 B1 | 8/2005 | Chen |
| 6,934,129 B1 | 8/2005 | Zhang et al. |
| 6,940,688 B2 | 9/2005 | Jiang et al. |
| 6,942,824 B1 | 9/2005 | Li |
| 6,943,993 B2 | 9/2005 | Chang et al. |
| 6,944,938 B1 | 9/2005 | Crue, Jr. et al. |
| 6,947,258 B1 | 9/2005 | Li |
| 6,950,266 B1 | 9/2005 | McCaslin et al. |
| 6,954,332 B1 | 10/2005 | Hong et al. |
| 6,958,885 B1 | 10/2005 | Chen et al. |
| 6,961,221 B1 | 11/2005 | Niu et al. |
| 6,969,989 B1 | 11/2005 | Mei |
| 6,975,486 B2 | 12/2005 | Chen et al. |
| 6,987,643 B1 | 1/2006 | Seagle |
| 6,989,962 B1 | 1/2006 | Dong et al. |
| 6,989,972 B1 | 1/2006 | Stoev et al. |
| 7,006,327 B2 | 2/2006 | Krounbi et al. |
| 7,007,372 B1 | 3/2006 | Chen et al. |
| 7,012,832 B1 | 3/2006 | Sin et al. |
| 7,023,658 B1 | 4/2006 | Knapp et al. |
| 7,026,063 B2 | 4/2006 | Ueno et al. |
| 7,027,268 B1 | 4/2006 | Zhu et al. |
| 7,027,274 B1 | 4/2006 | Sin et al. |
| 7,035,046 B1 | 4/2006 | Young et al. |
| 7,041,985 B1 | 5/2006 | Wang et al. |
| 7,042,686 B2 | 5/2006 | Hiramoto et al. |
| 7,046,490 B1 | 5/2006 | Ueno et al. |
| 7,054,113 B1 | 5/2006 | Seagle et al. |
| 7,057,857 B1 | 6/2006 | Niu et al. |
| 7,059,868 B1 | 6/2006 | Yan |
| 7,092,195 B1 | 8/2006 | Liu et al. |
| 7,110,289 B1 | 9/2006 | Sin et al. |
| 7,111,382 B1 | 9/2006 | Knapp et al. |
| 7,113,366 B1 | 9/2006 | Wang et al. |
| 7,114,241 B2 | 10/2006 | Kubota et al. |
| 7,116,517 B1 | 10/2006 | He et al. |
| 7,124,654 B1 | 10/2006 | Davies et al. |
| 7,126,788 B1 | 10/2006 | Liu et al. |
| 7,126,790 B1 | 10/2006 | Liu et al. |
| 7,131,346 B1 | 11/2006 | Buttar et al. |
| 7,133,253 B1 | 11/2006 | Seagle et al. |
| 7,134,185 B1 | 11/2006 | Knapp et al. |
| 7,154,715 B2 | 12/2006 | Yamanaka et al. |
| 7,170,725 B1 | 1/2007 | Zhou et al. |
| 7,177,117 B1 | 2/2007 | Jiang et al. |
| 7,193,815 B1 | 3/2007 | Stoev et al. |
| 7,196,880 B1 | 3/2007 | Anderson et al. |
| 7,199,974 B1 | 4/2007 | Alfoqaha |
| 7,199,975 B1 | 4/2007 | Pan |
| 7,211,339 B1 | 5/2007 | Seagle et al. |
| 7,212,384 B1 | 5/2007 | Stoev et al. |
| 7,238,292 B1 | 7/2007 | He et al. |
| 7,239,478 B1 | 7/2007 | Sin et al. |
| 7,248,431 B1 | 7/2007 | Liu et al. |
| 7,248,433 B1 | 7/2007 | Stoev et al. |
| 7,248,449 B1 | 7/2007 | Seagle |
| 7,280,325 B1 | 10/2007 | Pan |
| 7,283,327 B1 | 10/2007 | Liu et al. |
| 7,284,316 B1 | 10/2007 | Huai et al. |
| 7,286,329 B1 | 10/2007 | Chen et al. |
| 7,289,303 B1 | 10/2007 | Sin et al. |
| 7,292,409 B1 | 11/2007 | Stoev et al. |
| 7,296,339 B1 | 11/2007 | Yang et al. |
| 7,307,814 B1 | 12/2007 | Seagle et al. |
| 7,307,818 B1 | 12/2007 | Park et al. |
| 7,310,204 B1 | 12/2007 | Stoev et al. |
| 7,310,207 B2 | 12/2007 | Hasegawa et al. |
| 7,310,208 B2 * | 12/2007 | Hasegawa et al. ........ 360/324.11 |
| 7,318,947 B1 | 1/2008 | Park et al. |
| 7,333,295 B1 | 2/2008 | Medina et al. |
| 7,336,451 B2 | 2/2008 | Saito |
| 7,336,453 B2 | 2/2008 | Hasegawa et al. |
| 7,337,530 B1 | 3/2008 | Stoev et al. |
| 7,342,752 B1 | 3/2008 | Zhang et al. |
| 7,349,170 B1 | 3/2008 | Rudman et al. |
| 7,349,179 B1 | 3/2008 | He et al. |
| 7,354,664 B1 | 4/2008 | Jiang et al. |
| 7,363,697 B1 | 4/2008 | Dunn et al. |
| 7,371,152 B1 | 5/2008 | Newman |
| 7,372,665 B1 | 5/2008 | Stoev et al. |
| 7,375,926 B1 | 5/2008 | Stoev et al. |
| 7,379,269 B1 | 5/2008 | Krounbi et al. |
| 7,386,933 B1 | 6/2008 | Krounbi et al. |
| 7,389,577 B1 | 6/2008 | Shang et al. |
| 7,417,832 B1 | 8/2008 | Erickson et al. |
| 7,419,891 B1 | 9/2008 | Chen et al. |
| 7,428,124 B1 | 9/2008 | Song et al. |
| 7,430,098 B1 | 9/2008 | Song et al. |
| 7,436,620 B1 | 10/2008 | Kang et al. |
| 7,436,638 B1 | 10/2008 | Pan |
| 7,440,220 B1 | 10/2008 | Kang et al. |
| 7,443,632 B1 | 10/2008 | Stoev et al. |

(56) References Cited

U.S. PATENT DOCUMENTS

| | | |
|---|---|---|
| 7,444,740 B1 | 11/2008 | Chung et al. |
| 7,466,525 B2 | 12/2008 | Hasegawa et al. |
| 7,480,122 B2 | 1/2009 | Ide et al. |
| 7,493,688 B1 | 2/2009 | Wang et al. |
| 7,508,627 B1 | 3/2009 | Zhang et al. |
| 7,522,377 B1 | 4/2009 | Jiang et al. |
| 7,522,379 B1 | 4/2009 | Krounbi et al. |
| 7,522,382 B1 | 4/2009 | Pan |
| 7,542,246 B1 | 6/2009 | Song et al. |
| 7,551,406 B1 | 6/2009 | Thomas et al. |
| 7,552,523 B1 | 6/2009 | He et al. |
| 7,554,767 B1 | 6/2009 | Hu et al. |
| 7,554,776 B2 | 6/2009 | Hasegawa et al. |
| 7,558,028 B2 | 7/2009 | Carey et al. |
| 7,583,466 B2 | 9/2009 | Kermiche et al. |
| 7,595,967 B1 | 9/2009 | Moon et al. |
| 7,602,592 B2 | 10/2009 | Fukuzawa et al. |
| 7,639,457 B1 | 12/2009 | Chen et al. |
| 7,660,080 B1 | 2/2010 | Liu et al. |
| 7,667,933 B2 | 2/2010 | Kudo et al. |
| 7,672,080 B1 | 3/2010 | Tang et al. |
| 7,672,086 B1 | 3/2010 | Jiang |
| 7,684,160 B1 | 3/2010 | Erickson et al. |
| 7,688,546 B1 | 3/2010 | Bai et al. |
| 7,691,434 B1 | 4/2010 | Zhang et al. |
| 7,695,761 B1 | 4/2010 | Shen et al. |
| 7,719,795 B2 | 5/2010 | Hu et al. |
| 7,726,009 B1 | 6/2010 | Liu et al. |
| 7,729,086 B1 | 6/2010 | Song et al. |
| 7,729,087 B1 | 6/2010 | Stoev et al. |
| 7,736,823 B1 | 6/2010 | Wang et al. |
| 7,760,473 B2 | 7/2010 | Ide et al. |
| 7,785,666 B1 | 8/2010 | Sun et al. |
| 7,796,356 B1 | 9/2010 | Fowler et al. |
| 7,800,858 B1 | 9/2010 | Bajikar et al. |
| 7,819,979 B1 | 10/2010 | Chen et al. |
| 7,829,264 B1 | 11/2010 | Wang et al. |
| 7,846,643 B1 | 12/2010 | Sun et al. |
| 7,855,854 B2 | 12/2010 | Hu et al. |
| 7,869,160 B1 | 1/2011 | Pan et al. |
| 7,872,824 B1 | 1/2011 | Macchioni et al. |
| 7,872,833 B2 | 1/2011 | Hu et al. |
| 7,910,267 B1 | 3/2011 | Zeng et al. |
| 7,911,735 B1 | 3/2011 | Sin et al. |
| 7,911,737 B1 | 3/2011 | Jiang et al. |
| 7,916,426 B2 | 3/2011 | Hu et al. |
| 7,918,013 B1 | 4/2011 | Dunn et al. |
| 7,968,219 B1 | 6/2011 | Jiang et al. |
| 7,982,989 B1 | 7/2011 | Shi et al. |
| 8,008,912 B1 | 8/2011 | Shang |
| 8,012,804 B1 | 9/2011 | Wang et al. |
| 8,015,692 B1 | 9/2011 | Zhang et al. |
| 8,018,677 B1 | 9/2011 | Chung et al. |
| 8,018,678 B1 | 9/2011 | Zhang et al. |
| 8,024,748 B1 | 9/2011 | Moravec et al. |
| 8,072,705 B1 | 12/2011 | Wang et al. |
| 8,074,345 B1 | 12/2011 | Anguelouch et al. |
| 8,077,418 B1 | 12/2011 | Hu et al. |
| 8,077,434 B1 | 12/2011 | Shen et al. |
| 8,077,435 B1 | 12/2011 | Liu et al. |
| 8,077,557 B1 | 12/2011 | Hu et al. |
| 8,079,135 B1 | 12/2011 | Shen et al. |
| 8,081,403 B1 | 12/2011 | Chen et al. |
| 8,091,210 B1 | 1/2012 | Sasaki et al. |
| 8,097,846 B1 | 1/2012 | Anguelouch et al. |
| 8,104,166 B1 | 1/2012 | Zhang et al. |
| 8,116,043 B2 | 2/2012 | Leng et al. |
| 8,116,171 B1 | 2/2012 | Lee |
| 8,125,856 B1 | 2/2012 | Li et al. |
| 8,134,794 B1 | 3/2012 | Wang |
| 8,136,224 B1 | 3/2012 | Sun et al. |
| 8,136,225 B1 | 3/2012 | Zhang et al. |
| 8,136,805 B1 | 3/2012 | Lee |
| 8,141,235 B1 | 3/2012 | Zhang |
| 8,146,236 B1 | 4/2012 | Luo et al. |
| 8,149,536 B1 | 4/2012 | Yang et al. |
| 8,151,441 B1 | 4/2012 | Rudy et al. |
| 8,163,185 B1 | 4/2012 | Sun et al. |
| 8,164,760 B2 | 4/2012 | Willis |
| 8,164,855 B1 | 4/2012 | Gibbons et al. |
| 8,164,864 B2 | 4/2012 | Kaiser et al. |
| 8,165,709 B1 | 4/2012 | Rudy |
| 8,166,631 B1 | 5/2012 | Tran et al. |
| 8,166,632 B1 | 5/2012 | Zhang et al. |
| 8,169,473 B1 | 5/2012 | Yu et al. |
| 8,171,618 B1 | 5/2012 | Wang et al. |
| 8,179,636 B1 | 5/2012 | Bai et al. |
| 8,191,237 B1 | 6/2012 | Luo et al. |
| 8,194,365 B1 | 6/2012 | Leng et al. |
| 8,194,366 B1 | 6/2012 | Li et al. |
| 8,196,285 B1 | 6/2012 | Zhang et al. |
| 8,200,054 B1 | 6/2012 | Li et al. |
| 8,203,800 B2 | 6/2012 | Li et al. |
| 8,208,350 B1 | 6/2012 | Hu et al. |
| 8,220,140 B1 | 7/2012 | Wang et al. |
| 8,222,599 B1 | 7/2012 | Chien |
| 8,225,488 B1 | 7/2012 | Zhang et al. |
| 8,227,023 B1 | 7/2012 | Liu et al. |
| 8,228,633 B1 | 7/2012 | Tran et al. |
| 8,231,796 B1 | 7/2012 | Li et al. |
| 8,233,248 B1 | 7/2012 | Li et al. |
| 8,248,896 B1 | 8/2012 | Yuan et al. |
| 8,254,060 B1 | 8/2012 | Shi et al. |
| 8,257,597 B1 | 9/2012 | Guan et al. |
| 8,259,410 B1 | 9/2012 | Bai et al. |
| 8,259,539 B1 | 9/2012 | Hu et al. |
| 8,262,918 B1 | 9/2012 | Li et al. |
| 8,262,919 B1 | 9/2012 | Luo et al. |
| 8,264,797 B2 | 9/2012 | Emley |
| 8,264,798 B1 | 9/2012 | Guan et al. |
| 8,270,126 B1 | 9/2012 | Roy et al. |
| 8,276,258 B1 | 10/2012 | Tran et al. |
| 8,277,669 B1 | 10/2012 | Chen et al. |
| 8,279,719 B1 | 10/2012 | Hu et al. |
| 8,284,517 B1 | 10/2012 | Sun et al. |
| 8,288,204 B1 | 10/2012 | Wang et al. |
| 8,289,821 B1 | 10/2012 | Huber |
| 8,291,743 B1 | 10/2012 | Shi et al. |
| 8,307,539 B1 | 11/2012 | Rudy et al. |
| 8,307,540 B1 | 11/2012 | Tran et al. |
| 8,308,921 B1 | 11/2012 | Hiner et al. |
| 8,310,785 B1 | 11/2012 | Zhang et al. |
| 8,310,901 B1 | 11/2012 | Batra et al. |
| 8,315,019 B1 | 11/2012 | Mao et al. |
| 8,316,527 B2 | 11/2012 | Hong et al. |
| 8,320,076 B1 | 11/2012 | Shen et al. |
| 8,320,077 B1 | 11/2012 | Tang et al. |
| 8,320,219 B1 | 11/2012 | Wolf et al. |
| 8,320,220 B1 | 11/2012 | Yuan et al. |
| 8,320,722 B1 | 11/2012 | Yuan et al. |
| 8,322,022 B1 | 12/2012 | Yi et al. |
| 8,322,023 B1 | 12/2012 | Zeng et al. |
| 8,325,569 B1 | 12/2012 | Shi et al. |
| 8,333,008 B1 | 12/2012 | Sin et al. |
| 8,334,093 B2 | 12/2012 | Zhang et al. |
| 8,336,194 B2 | 12/2012 | Yuan et al. |
| 8,339,738 B1 | 12/2012 | Tran et al. |
| 8,341,826 B1 | 1/2013 | Jiang et al. |
| 8,343,319 B1 | 1/2013 | Li et al. |
| 8,343,364 B1 | 1/2013 | Gao et al. |
| 8,349,195 B1 | 1/2013 | Si et al. |
| 8,351,307 B1 | 1/2013 | Wolf et al. |
| 8,357,244 B1 | 1/2013 | Zhao et al. |
| 8,373,945 B1 | 2/2013 | Luo et al. |
| 8,375,564 B1 | 2/2013 | Luo et al. |
| 8,375,565 B2 | 2/2013 | Hu et al. |
| 8,381,391 B1 | 2/2013 | Park et al. |
| 8,385,157 B1 | 2/2013 | Champion et al. |
| 8,385,158 B1 | 2/2013 | Hu et al. |
| 8,394,280 B1 | 3/2013 | Wan et al. |
| 8,400,731 B1 | 3/2013 | Li et al. |
| 8,404,128 B1 | 3/2013 | Zhang et al. |
| 8,404,129 B1 | 3/2013 | Luo et al. |
| 8,405,930 B1 | 3/2013 | Li et al. |

(56) References Cited

U.S. PATENT DOCUMENTS

| | | |
|---|---|---|
| 8,409,453 B1 | 4/2013 | Jiang et al. |
| 8,413,317 B1 | 4/2013 | Wan et al. |
| 8,416,540 B1 | 4/2013 | Li et al. |
| 8,419,953 B1 | 4/2013 | Su et al. |
| 8,419,954 B1 | 4/2013 | Chen et al. |
| 8,422,176 B1 | 4/2013 | Leng et al. |
| 8,422,342 B1 | 4/2013 | Lee |
| 8,422,841 B1 | 4/2013 | Shi et al. |
| 8,424,192 B1 | 4/2013 | Yang et al. |
| 8,441,756 B1 | 5/2013 | Sun et al. |
| 8,443,510 B1 | 5/2013 | Shi et al. |
| 8,444,866 B1 | 5/2013 | Guan et al. |
| 8,449,948 B2 | 5/2013 | Medina et al. |
| 8,451,556 B1 | 5/2013 | Wang et al. |
| 8,451,563 B1 | 5/2013 | Zhang et al. |
| 8,454,846 B1 | 6/2013 | Zhou et al. |
| 8,455,119 B1 | 6/2013 | Jiang et al. |
| 8,456,961 B1 | 6/2013 | Wang et al. |
| 8,456,963 B1 | 6/2013 | Hu et al. |
| 8,456,964 B1 | 6/2013 | Yuan et al. |
| 8,456,966 B1 | 6/2013 | Shi et al. |
| 8,456,967 B1 | 6/2013 | Mallary |
| 8,458,892 B2 | 6/2013 | Si et al. |
| 8,462,592 B1 | 6/2013 | Wolf et al. |
| 8,468,682 B1 | 6/2013 | Zhang |
| 8,472,288 B1 | 6/2013 | Wolf et al. |
| 8,480,911 B1 | 7/2013 | Osugi et al. |
| 8,486,285 B2 | 7/2013 | Zhou et al. |
| 8,486,286 B1 | 7/2013 | Gao et al. |
| 8,488,272 B1 | 7/2013 | Tran et al. |
| 8,491,801 B1 | 7/2013 | Tanner et al. |
| 8,491,802 B1 | 7/2013 | Gao et al. |
| 8,493,693 B1 | 7/2013 | Zheng et al. |
| 8,493,695 B1 | 7/2013 | Kaiser et al. |
| 8,495,813 B1 | 7/2013 | Hu et al. |
| 8,498,084 B1 | 7/2013 | Leng et al. |
| 8,506,828 B1 | 8/2013 | Osugi et al. |
| 8,514,517 B1 | 8/2013 | Batra et al. |
| 8,518,279 B1 | 8/2013 | Wang et al. |
| 8,518,832 B1 | 8/2013 | Yang et al. |
| 8,520,336 B1 | 8/2013 | Liu et al. |
| 8,520,337 B1 | 8/2013 | Liu et al. |
| 8,524,068 B2 | 9/2013 | Medina et al. |
| 8,526,275 B1 | 9/2013 | Yuan et al. |
| 8,531,801 B1 | 9/2013 | Xiao et al. |
| 8,532,450 B1 | 9/2013 | Wang et al. |
| 8,533,937 B1 | 9/2013 | Wang et al. |
| 8,537,494 B1 | 9/2013 | Pan et al. |
| 8,537,495 B1 | 9/2013 | Luo et al. |
| 8,537,502 B1 | 9/2013 | Park et al. |
| 8,545,999 B1 | 10/2013 | Leng et al. |
| 8,547,659 B1 | 10/2013 | Bai et al. |
| 8,547,667 B1 | 10/2013 | Roy et al. |
| 8,547,730 B1 | 10/2013 | Shen et al. |
| 8,555,486 B1 | 10/2013 | Medina et al. |
| 8,559,141 B1 | 10/2013 | Pakala et al. |
| 8,563,146 B1 | 10/2013 | Zhang et al. |
| 8,565,049 B1 | 10/2013 | Tanner et al. |
| 8,576,517 B1 | 11/2013 | Tran et al. |
| 8,578,594 B2 | 11/2013 | Jiang et al. |
| 8,582,238 B1 | 11/2013 | Liu et al. |
| 8,582,241 B1 | 11/2013 | Yu et al. |
| 8,582,253 B1 | 11/2013 | Zheng et al. |
| 8,588,039 B1 | 11/2013 | Shi et al. |
| 8,593,914 B2 | 11/2013 | Wang et al. |
| 8,597,528 B1 | 12/2013 | Roy et al. |
| 8,599,520 B1 | 12/2013 | Liu et al. |
| 8,599,657 B1 | 12/2013 | Lee |
| 8,603,593 B1 | 12/2013 | Roy et al. |
| 8,607,438 B1 | 12/2013 | Gao et al. |
| 8,607,439 B1 | 12/2013 | Wang et al. |
| 8,611,035 B1 | 12/2013 | Bajikar et al. |
| 8,611,054 B1 | 12/2013 | Shang et al. |
| 8,611,055 B1 | 12/2013 | Pakala et al. |
| 8,614,864 B1 | 12/2013 | Hong et al. |
| 8,619,512 B1 | 12/2013 | Yuan et al. |
| 8,625,233 B1 | 1/2014 | Ji et al. |
| 8,625,941 B1 | 1/2014 | Shi et al. |
| 8,628,672 B1 | 1/2014 | Si et al. |
| 8,630,068 B1 | 1/2014 | Mauri et al. |
| 8,634,280 B1 | 1/2014 | Wang et al. |
| 8,638,529 B1 | 1/2014 | Leng et al. |
| 8,643,980 B1 | 2/2014 | Fowler et al. |
| 8,649,123 B1 | 2/2014 | Zhang et al. |
| 8,665,561 B1 | 3/2014 | Knutson et al. |
| 8,670,211 B1 | 3/2014 | Sun et al. |
| 8,670,213 B1 | 3/2014 | Zeng et al. |
| 8,670,214 B1 | 3/2014 | Knutson et al. |
| 8,670,294 B1 | 3/2014 | Shi et al. |
| 8,670,295 B1 | 3/2014 | Hu et al. |
| 8,675,318 B1 | 3/2014 | Ho et al. |
| 8,675,455 B1 | 3/2014 | Krichevsky et al. |
| 8,681,594 B1 | 3/2014 | Shi et al. |
| 8,689,430 B1 | 4/2014 | Chen et al. |
| 8,693,141 B1 | 4/2014 | Elliott et al. |
| 8,703,397 B1 | 4/2014 | Zeng et al. |
| 8,705,205 B1 | 4/2014 | Li et al. |
| 8,711,518 B1 | 4/2014 | Zeng et al. |
| 8,711,528 B1 | 4/2014 | Xiao et al. |
| 8,717,709 B1 | 5/2014 | Shi et al. |
| 8,720,044 B1 | 5/2014 | Tran et al. |
| 8,721,902 B1 | 5/2014 | Wang et al. |
| 8,724,259 B1 | 5/2014 | Liu et al. |
| 8,749,790 B1 | 6/2014 | Tanner et al. |
| 8,749,920 B1 | 6/2014 | Knutson et al. |
| 8,753,903 B1 | 6/2014 | Tanner et al. |
| 8,760,807 B1 | 6/2014 | Zhang et al. |
| 8,760,818 B1 | 6/2014 | Diao et al. |
| 8,760,819 B1 | 6/2014 | Liu et al. |
| 8,760,822 B1 | 6/2014 | Li et al. |
| 8,760,823 B1 | 6/2014 | Chen et al. |
| 8,763,235 B1 | 7/2014 | Wang et al. |
| 8,780,498 B1 | 7/2014 | Jiang et al. |
| 8,780,505 B1 | 7/2014 | Xiao |
| 8,786,983 B1 | 7/2014 | Liu et al. |
| 8,790,524 B1 | 7/2014 | Luo et al. |
| 8,790,527 B1 | 7/2014 | Luo et al. |
| 8,792,208 B1 | 7/2014 | Liu et al. |
| 8,792,312 B1 | 7/2014 | Wang et al. |
| 8,793,866 B1 | 8/2014 | Zhang et al. |
| 8,797,680 B1 | 8/2014 | Luo et al. |
| 8,797,684 B1 | 8/2014 | Tran et al. |
| 8,797,686 B1 | 8/2014 | Bai et al. |
| 8,797,692 B1 | 8/2014 | Guo et al. |
| 8,813,324 B2 | 8/2014 | Emley et al. |
| 2005/0266274 A1 | 12/2005 | Hasegawa et al. |
| 2006/0050444 A1 | 3/2006 | Fukuzawa et al. |
| 2008/0239591 A1* | 10/2008 | Fuji et al. ............... 360/324.12 |
| 2010/0072529 A1 | 3/2010 | Marukame et al. |
| 2010/0290157 A1 | 11/2010 | Zhang et al. |
| 2011/0086240 A1 | 4/2011 | Xiang et al. |
| 2012/0111826 A1 | 5/2012 | Chen et al. |
| 2012/0182647 A1* | 7/2012 | Fuke et al. ............... 360/313 |
| 2012/0216378 A1 | 8/2012 | Emley et al. |
| 2012/0237878 A1 | 9/2012 | Zeng et al. |
| 2012/0298621 A1 | 11/2012 | Gao |
| 2013/0128391 A1* | 5/2013 | Fuji et al. ............... 360/324.12 |
| 2013/0216702 A1 | 8/2013 | Kaiser et al. |
| 2013/0216863 A1 | 8/2013 | Li et al. |
| 2013/0257421 A1 | 10/2013 | Shang et al. |
| 2014/0154529 A1 | 6/2014 | Yang et al. |
| 2014/0175050 A1 | 6/2014 | Zhang et al. |

OTHER PUBLICATIONS

T. Iwase, et al., "Large Interface Spin-Asymmetry and Magnetoresistance in Fully Epitaxial Co2MnSi/Ag/Co2MnSi Current-Perpendicular-to-Plane Magnetoresistive Devices", Appl. Phys. Exp., vol. 2, 2009, pp. 063003-063003-3.

J. Sato, et al., "Large Magnetoresistance Effect in Epitaxial Co2Fe0. 4Mn0.6Si/Ag/Co2Fe0.4Mn0.6Si Devices", Appl. Phys. Exp., vol. 4, 2011, pp. 113005-113007.

* cited by examiner

METHODS FOR PROVIDING MAGNETIC STORAGE ELEMENTS WITH HIGH MAGNETO-RESISTANCE USING HEUSLER ALLOYS

CROSS REFERENCE TO RELATED APPLICATION(S)

This application is a divisional of co-pending application Ser. No. 13/737,374 filed on Jan. 9, 2013 which is hereby incorporated by reference.

FIELD

The present invention relates generally to read sensors for magnetic disk drives, and more specifically to methods for providing magnetic storage elements with high magneto-resistance using Heusler alloys.

BACKGROUND

Figure 1:
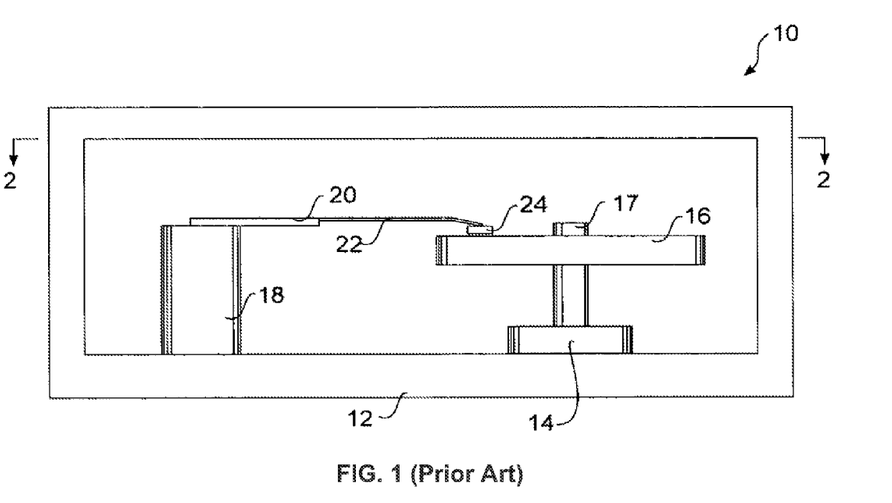
FIG. 1 is a partial cross sectional view of a magnetic data storage system in accordance with the prior art.
Figure 2:
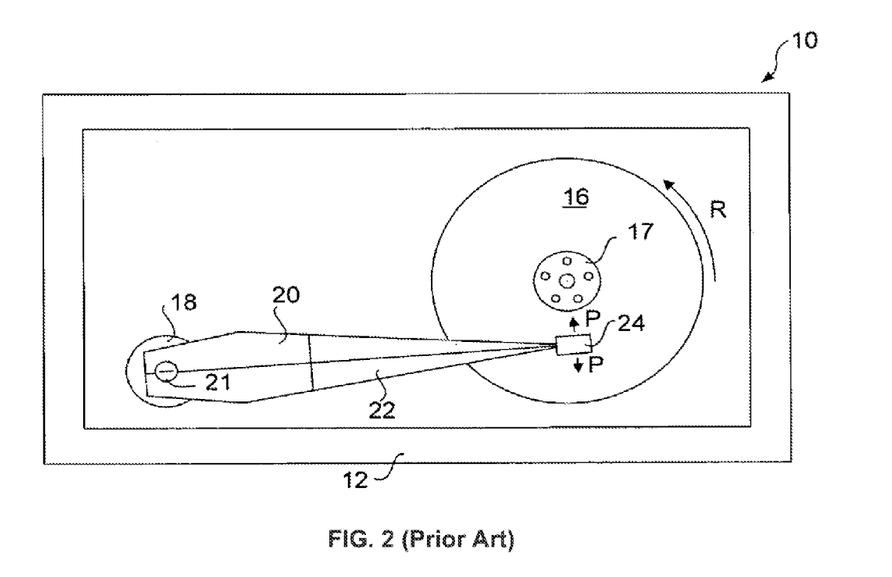
FIG. 2 is a partial cross sectional view taken along line 2-2 of FIG. 1 in accordance with the prior art.

Magnetic disk drives are used to store and retrieve data for digital electronic apparatuses such as computers. In FIGS. 1 and 2, a magnetic disk data storage system 10 includes a sealed enclosure 12, a disk drive motor 14, and a magnetic disk, or media, 16 supported for rotation by a drive spindle 17 of motor 14. Also included are an actuator 18 and an arm 20 attached to an actuator spindle 21 of actuator 18. A suspension 22 is coupled at one end to the arm 20 and at another end to a read/write head 24. The suspension 22 and the read/write head 24 are commonly collectively referred to as a head gimbal assembly (HGA). The read/write head 24 typically includes an inductive write element and a magneto-resistive read element that are held in a very close proximity to the magnetic disk 16. As the motor 14 rotates the magnetic disk 16, as indicated by the arrow R, an air bearing is formed under the read/write head 24 causing the read/write head to lift slightly off of the surface of the magnetic disk 16, or, as it is commonly termed in the art, to "fly" above the magnetic disk 16. Data bits can be written or read along a magnetic "track" of the magnetic disk 16 as the magnetic disk 16 rotates past the read/write head 24. The actuator 18 moves the read/write head 24 from one magnetic track to another by pivoting the arm 20 and the suspension 22 in an arc indicated by arrows P. The design of magnetic disk data storage system 10 is well known to those skilled in the art.

Figure 3:
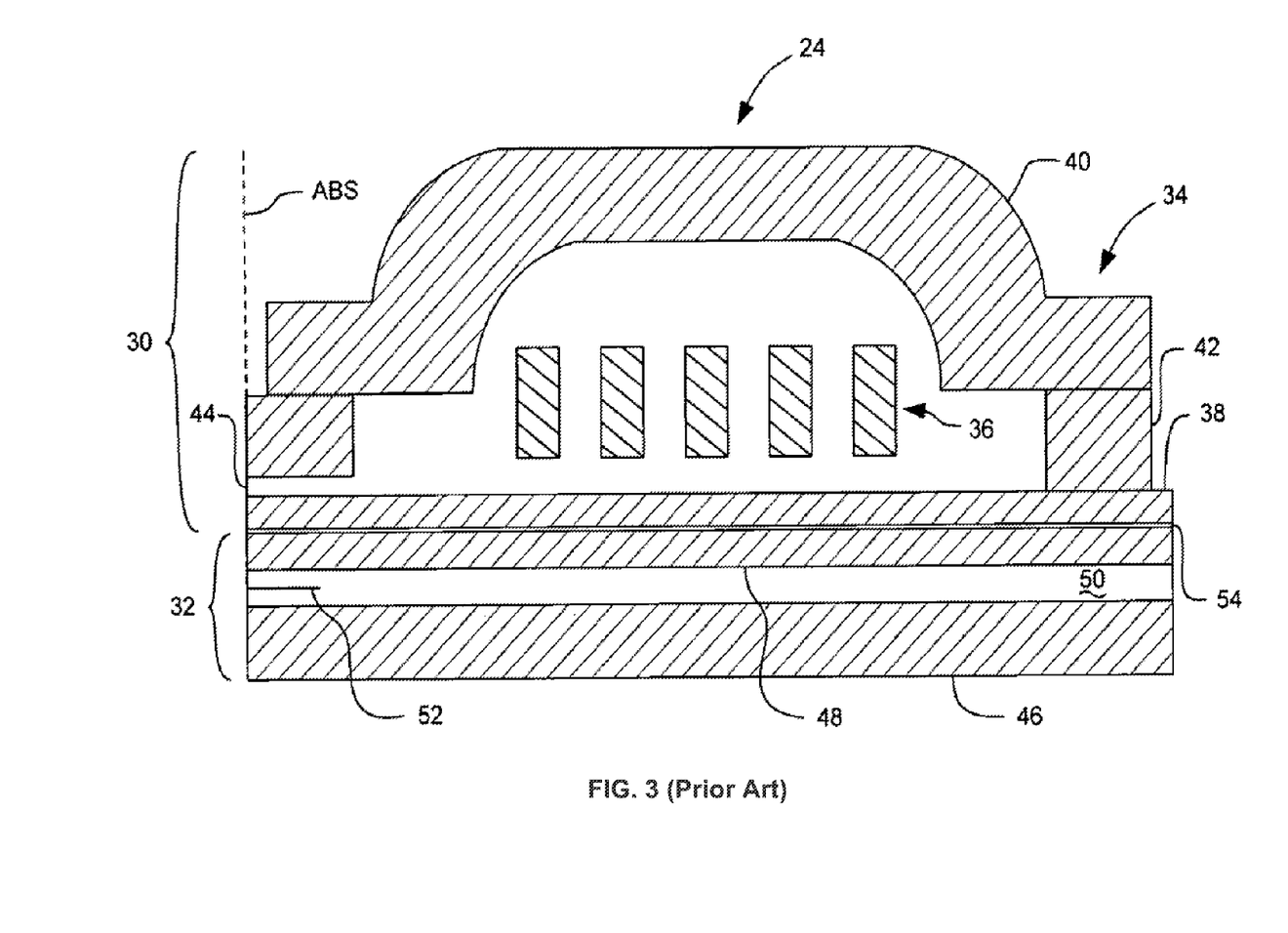
FIG. 3 is a cross sectional view of a read/write head in accordance with the prior art.

FIG. 3 shows a cross-sectional view of a read/write head 24. The read/write head 24 includes a write element 30 for writing data bits to the magnetic disk and a read element 32 for reading the data bits. The write element 30 includes a yoke 34 and one or more layers of electrically conductive coils 36 wound around the yoke 34. In operation, an electric current is passed through the coils 36 to induce a magnetic field in the yoke 34. The yoke 34 includes a lower pole 38 connected to an upper pole 40 by a back gap 42 at a back gap end. The lower and upper poles 38, 40 oppose each other across a write gap 44 at an air bearing end. The yoke 34 is commonly formed of ferromagnetic materials.

The read element 32 includes a first shield 46, a second shield 48, a read insulation layer 50 disposed between the first shield 46 and the second shield 48, and a read sensor 52 disposed within the read insulation layer 50 and exposed at an air bearing surface (ABS). In some designs, often referred to as "merged head" designs, second shield 48 and lower pole 38 are the same layer. In other designs, such as the one shown in FIG. 3, a thin insulating layer 54 separates the second shield 48 from the lower pole 38.

In existing read sensors (e.g., current perpendicular to plane or "CPP" giant magneto-resistance or "GMR" film stack read sensors) with conventional magnetic material such as CoFe and CoFeB, the read signal is small with limited CPP GMR ratio (less than 2% as usual) that does not meet requirements for large signal to noise ratio (SNR) applications. For those with Heusler alloy material based read sensor elements, a large CPP GMR ratio up to tens of percentage is available but with bulky stack design and epitaxial growth of films on crystalline oriented MgO(100) substrates. These read sensors are not suitable for hard drive and magneto-resistive random access memory (MRAM) applications in terms of requirements on small shield to shield spacing and improved performance of devices using such read sensors for high areal density recording.

Conventional efforts utilizing Heusler alloy materials in CPP GMR devices have explored widely the potential and possibility for enhanced output signal and largely improved SNR. However, the output signal from such devices remains on the low side, in particular for small shield to shield spacing form factors. The major challenges lie on the fact that crystal structure of Heusler alloy multi-layers need to be modulated such that they are compatible with L21/B2 ordering to realize half metallicity and large spin polarization with epitaxial growth of thin films. Accordingly, what is needed is an improved magnetic storage element that provides improved electrical performance while providing small shield to shield spacing on a NiFe substrate.

SUMMARY

Aspects of the invention relate to methods for providing magnetic storage elements with high magneto-resistance using Heusler alloys. In one embodiment, the invention relates to a method for manufacturing a magnetic storage element, the method including depositing a substrate including NiFe, depositing a seed layer on the substrate, depositing a buffer layer on the seed layer, and growing, epitaxially, an upper layer on the buffer layer, the upper layer including a Heusler alloy.

In another embodiment, the invention relates to a magnetic storage element including a substrate including NiFe, a seed layer on the substrate, a buffer layer on the seed layer, and an upper layer on the buffer layer, the upper layer including a Heusler alloy grown epitaxially.

In one embodiment, the substrate has a first crystalline structure, and the seed layer and the buffer layer are configured to provide a foundation structure for the Heusler alloy of the upper layer that is different from the first crystalline structure.

DETAILED DESCRIPTION

Referring now to the drawings, embodiments of methods for providing magnetic storage elements with high magneto-resistance using Heusler alloys are illustrated. The systems include a substrate made of NiFe, a seed layer on the substrate, a buffer layer on the seed layer, and an upper layer on the buffer layer, where the upper layer includes a Heusler alloy grown epitaxially. The seed and buffer layers are configured to facilitate the epitaxial growth of the Heusler alloy with a crystalline structure that is substantially independent of that of the NiFe substrate. In many embodiments, the systems can include additional layers (e.g., free layer, reference layer, spacer layer, and/or capping layer) in various configurations to form a top spin valve, a bottom spin valve, or a pseudo spin valve magnetic storage element. The methods include processes for forming these magnetic storage elements.

In several embodiments, the Heusler alloy has a L21/B2 ordering and/or includes a $Co_2Fe_xMn_{1-x}Si$ or CFMS alloy, where x is between 0 and 1. The improved magnetic storage elements can provide enhanced electrical characteristics such as high magneto-resistance and signal output while also providing enhanced physical characteristics such as thin Heusler layer stacking that results in small shield to shield spacing.

Figure 4:
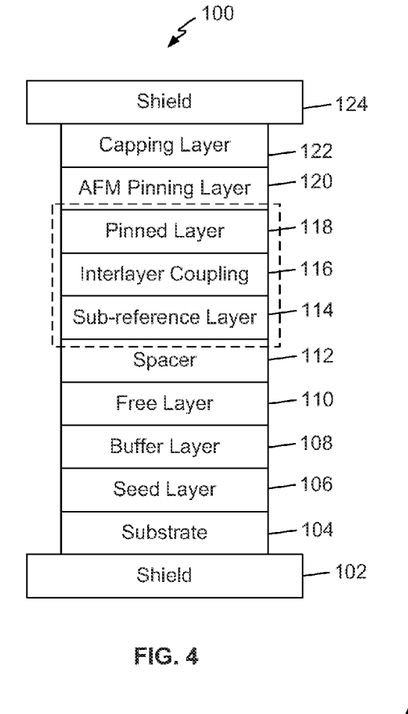
FIG. 4 is a cross sectional view of a magnetic storage element with high magneto-resistance in a top spin valve configuration with seed and buffer layers on a NiFe substrate that are configured to support formation of one or more Heusler alloy layers in accordance with one embodiment of the invention.

FIG. 4 is a cross sectional view of a magnetic storage element 100 with high magneto-resistance in a top spin valve configuration with seed and buffer layers on a NiFe substrate that are configured to support formation of one or more Heusler alloy layers in accordance with one embodiment of the invention. The magnetic storage element 100 includes a multi-layer stacked structure with a bottom shield layer 102, a substrate 104 on the bottom shield layer 102, a seed layer 106 on the substrate 104, a buffer layer 108 on the seed layer 106, a free layer 110 on the buffer layer 108, a spacer layer 112 on the free layer 110, a sub-reference layer 114 on the spacer layer 112, an interlayer coupling layer 116 on the sub-reference layer 114, a pinned layer 118 on the interlayer coupling layer 116, an anti-ferromagnetic (AFM) pinning layer 120 on the pinned layer 118, a capping layer 122 on the AFM pinning layer 120, and a top shield layer 124 on the capping layer 122.

In several embodiments, the sub-reference layer 114, the interlayer coupling layer 116, and the pinned layer 118 are collectively referred to as the reference layer. In several embodiments, the AFM pinning layer 120 is an optional layer.

The bottom and top shield layers (102, 124) are made of suitable shield materials known in the art. The substrate 102 is made of NiFe and other suitable materials. The seed layer 106 can be made of a multi-layer structure that includes one or more materials such as NiFe, Ta, Ti, amorphous CoFeB, CoFe, a material including a magnetic CFMS Heusler alloy, and combinations thereof. In one embodiment, the seed layer 106 is made of a bottom NiFe layer that is about 2 nanometers (nm) thick, a CoFeB layer that is about 2 nm thick, and a CoFe layer that is about 4.5 nm thick. In other embodiments, other suitable layers and thicknesses can be used. The buffer layer 108 can be made of a multi-layer structure that includes one or more materials such as Ta, Ti, Cr, Ru, Cu, Ag, Al, W, a Ta alloy, a Cr alloy, a Ru alloy, a Cu alloy, a Ag alloy, a W alloy, a NiAl alloy, and combinations thereof.

In one embodiment, buffer layer 108 is made of a bottom Cr layer that is about 1 nm thick and a Ag layer that is about 1 nm thick. In such case, the seed layer 106 can be made of a bottom NiFe layer that is about 2 nanometers (nm) thick, a CoFeB layer that is about 2 nm thick, and a CoFe25 layer that is about 4.5 nm thick. In such case, the NiFe layer of the seed layer 106 provides a contact layer for wafer substrate 104 for adhesion and stress adjustment. The CoFeB provides an amorphous platform upon which the CoFe25 layer is grown to form a body-centered cubic (BCC) like structure. On the top of these seed layers 106, the buffer layer 108 of Cr/Ag is grown to provide (110) orientated texture and lattice match with Heusler alloy layers (e.g., free layer 110) that are to be grown epitaxially.

The free layer 110 can be a single or multi-layer structure made of one or more Heusler alloys grown epitaxially on the buffer layer 108. The Heusler alloys can have a L21/B2 ordering and/or include a $Co_2Fe_xMn_{1-x}Si$ or CFMS alloy, where x is between 0 and 1. The spacer layer 112 can be made of suitable materials known in the art. The sub-reference layer 114 can be a single or multi-layer structure made of Co, Fe, CoFe, and/or one or more Heusler alloys grown epitaxially on the spacer layer 112. The Heusler alloys can have a L21/B2 ordering and/or include a CFMS alloy. The interlayer coupling layer 116 can be made of Ru, Cr, Cu, Ta, Ag, and/or other suitable materials known in the art. The pinned layer 118 can be made of Co, Fe, CoFe, one or more Heusler alloys, and/or other suitable ferromagnetic materials. The AFM pinning layer 120 can be made of anti-ferromagnetic materials such as IrMn, FeMn, PtMn, and/or other suitable materials known in the art. The capping layer 122 can be made of Ru, Ta, Ti, and/or other suitable materials known in the art.

In several embodiments, the seed layer 106 and buffer layer 108 are configured to facilitate an epitaxial growth of the Heusler alloy of the free layer 110. More specifically, the seed layer 106 can be configured to substantially obstruct a transfer of a first crystalline structure of the substrate 104 to the buffer layer 108 and the free layer 110, thereby preventing the transfer of the first crystalline structure to the Heusler alloy of the free layer 110. In several embodiments, the seed layer 106 is configured to provide a second crystalline structure different from the first crystalline structure of the NiFe substrate 104. In such case, the buffer layer 108 is configured to substantially maintain the second crystalline structure of the seed layer 106, and a crystalline structure of the free layer 110 (e.g., Heusler alloy) grown epitaxially on the buffer layer 106 should substantially match the second crystalline structure of the buffer layer 108 and the seed layer 106. In one embodiment, the first crystalline structure has a face-centered cubic (FCC) structure, and the second crystalline structure has a structure that is about body-centered cubic (BCC).

In some embodiments, the seed layer 106 includes a first magnetic sub-layer with an amorphous structure and a second magnetic sub-layer with the second crystalline structure that is about body-centered cubic. In such case, the second crystalline structure is developed through a process for changing the amorphous structure of the first magnetic sub-layer, where the process is an annealing process, a phase change process, a re-crystallization process, a combination of those processes, and/or another suitable process known in the art.

In a number of embodiments, the seed layer 106 and the buffer layer 108 are configured to provide a foundation structure for the Heusler alloy of the free layer 110 (e.g., upper layer) that is different from the first crystalline structure of the NiFe substrate 104. In several embodiments, the seed layer 106 has substantially magnetic characteristics, and the buffer layer 108 has substantially non-magnetic characteristics.

In one embodiment, the buffer layer 108 includes one or more materials selected from the group consisting of Cu2CrAl, Cu2AlSi, a material including a non-magnetic Heusler alloy, and combinations thereof. In several embodiments, the magnetic storage element 100 is a current perpendicular to plane (CPP) giant magneto-resistance (GMR) reader. In some embodiments, the substrate 104 and the seed layer 106 can act as a shield layer for the GMR reader. In some embodiments, one or both of shield layers (102, 124) are omitted.

In a number of embodiments, magnetic seed layers, buffer layers and their combined structure provide a platform and base on which the Heusler alloy multi-layers and stacks are grown expitaxially to maximize the crystalline structure match and enhance L21/B2 ordering and stoichiometric homogeneity. In one such case, the magnetic seed layers can also act as part of the shielding and the use of which can be optional for MRAM applications but preferable for hard drive applications.

In one embodiment, the total Heusler alloy layers are less than 15 nm in thickness. In one embodiment, the maximum CPP GMR ratio is about 9.0 and 13.0% for a device, corresponding to a maximum change in RA of about 4.5 and 7.0 $m\Omega\mu m^2$, respectively. In one embodiment, the maximum CPP GMR of 13.0% and change in RA of about 9.0 $m\Omega\mu m^2$ are obtained for a CPP GMR device.

In another embodiment, the reference/pinned layers have multi-layer structures. They consist of two ferromagnetic layers anti-ferromagnetically coupled by nonmagnetic coupling metal layers. The FM layers are made of Co, Fe, or Ni or their alloy or Heusler alloy layers. The interlayer coupling layers can be nonmagnetic metals (their alloys) such as Ru, Cr, Cu, Ta, and Ag. An optional intermediate layer can be included as a thin interfacial layer of less than 20 Angstroms in thickness can be inserted in between the ferromagnetic and interlayer coupling layer. The intermediate layers are preferably made of magnetic metals or alloys that can enhance interlayer coupling and set forth texture and crystalline structures of the magnetic Heusler alloy layers and other magnetic layers.

In one embodiment, the epitaxial growth of the stacking layers (e.g., Fe/Cr SAF pinned layers) up to the top Heusler layer CFMS follows the orientation relationship of CFMS (110) [001], Ag (110) [111], CFMS (110) [111] for a CPP GMR device. In such case, a resultant modulated crystalline structure with homogeneity in stoichiometry, of the device utilizing the Fe/Cr SAF pinned layers, improves homogeneity in the long-range ordering, and eventually the CPP GMR and device performance.

In several embodiments, the magnetic storage elements provide for large spin polarization and CPP GMR in magnetic elements utilizing Heusler systems, and the signal output on such devices is achieved with highly ordered L21/B2 Heusler phase using low temperature processes. With the improved epitaxial growth of CPP GMR films and modulated Heusler alloy composition, the magnetic ordering temperature is reduced for maximizing GMR and device performance for thin stack designs, while having scalability of device design to increase recording density.

In several embodiments, the magnetic storage elements provide for reduced shield-to-shield spacing (e.g., reduced by up to 10 nm as compared to conventional magnetic storage elements) and GMR gain up to two times conventional gain. In several embodiments, the large output signal and amplitude are available at low bias applied on the device, facilitating noise reduction including those from the spin transfer torque (STT) effect, and enhancement of SNR. In several embodiments, the improved magnetic storage elements can be used with MRAM device development and manufacturing in addition to hard drive applications.

Figure 5:
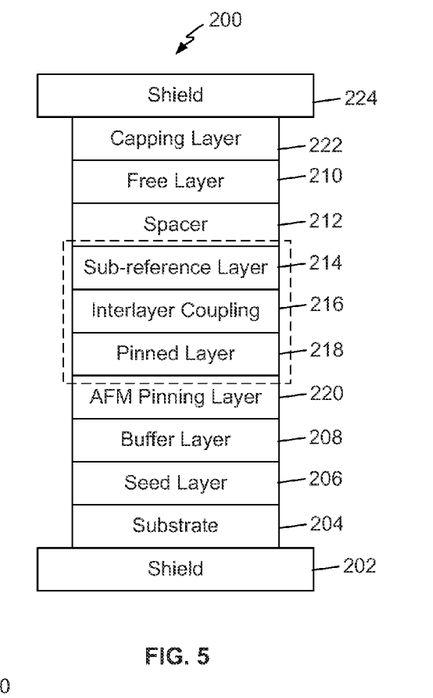
FIG. 5 is a cross sectional view of a magnetic storage element with high magneto-resistance in a bottom spin valve configuration with seed and buffer layers on a NiFe substrate that are configured to support formation of one or more Heusler alloy layers in accordance with one embodiment of the invention.

FIG. 5 is a cross sectional view of a magnetic storage element 200 with high magneto-resistance in a bottom spin valve configuration with seed and buffer layers on a NiFe substrate that are configured to support formation of one or more Heusler alloy layers in accordance with one embodiment of the invention. The magnetic storage element 200 includes a multi-layer stacked structure with a bottom shield layer 202, a substrate 204 on the bottom shield layer 202, a seed layer 206 on the substrate 204, a buffer layer 208 on the seed layer 206, an AFM pinning layer 220 on the buffer layer 208, a pinned layer 218 on the AFM pinning layer 220, an interlayer coupling layer 216 on the pinned layer 218, a sub-reference layer 214 on the interlayer coupling layer 216, a spacer layer 212 on the sub-reference layer 214, a free layer 210 on the spacer layer 212, a capping layer 222 on the free layer 210, and a top shield layer 224 on the capping layer 222.

In several embodiments, the sub-reference layer 214, the interlayer coupling layer 216, and the pinned layer 218 are collectively referred to as the reference layer. In several embodiments, the AFM pinning layer 220 is an optional layer.

In a number of embodiments, the materials and function of the layers of the magnetic storage element 200 can be the same, or substantially the same, as those described above for the magnetic storage element 100 of FIG. 4. In addition, the magnetic storage element 200 can also include the variations described above for the magnetic storage element 100 of FIG. 4.

Figure 6:
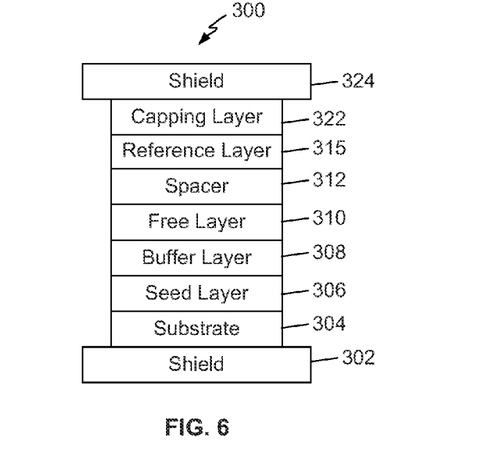
FIG. 6 is a cross sectional view of a magnetic storage element with high magneto-resistance in a pseudo spin valve configuration with seed and buffer layers on a NiFe substrate that are configured to support formation of one or more Heusler alloy layers in accordance with one embodiment of the invention.

FIG. 6 is a cross sectional view of a magnetic storage element 300 with high magneto-resistance in a pseudo spin valve configuration with seed and buffer layers on a NiFe substrate that are configured to support formation of one or more Heusler alloy layers in accordance with one embodiment of the invention. The magnetic storage element 300 includes a multi-layer stacked structure with a bottom shield layer 302, a substrate 304 on the bottom shield layer 302, a seed layer 306 on the substrate 304, a buffer layer 308 on the seed layer 306, a free layer 310 on the buffer layer 308, a spacer layer 312 on the free layer 310, a reference layer 315 on the spacer layer 312, a capping layer 322 on the reference layer 315, and a top shield layer 324 on the capping layer 322.

In a number of embodiments, the materials and function of the layers of the magnetic storage element 300 can be the same, or substantially the same, as those described above for the magnetic storage element 100 of FIG. 4. In addition, the magnetic storage element 300 can also include the variations described above for the magnetic storage element 100 of FIG. 4.

Figure 7:
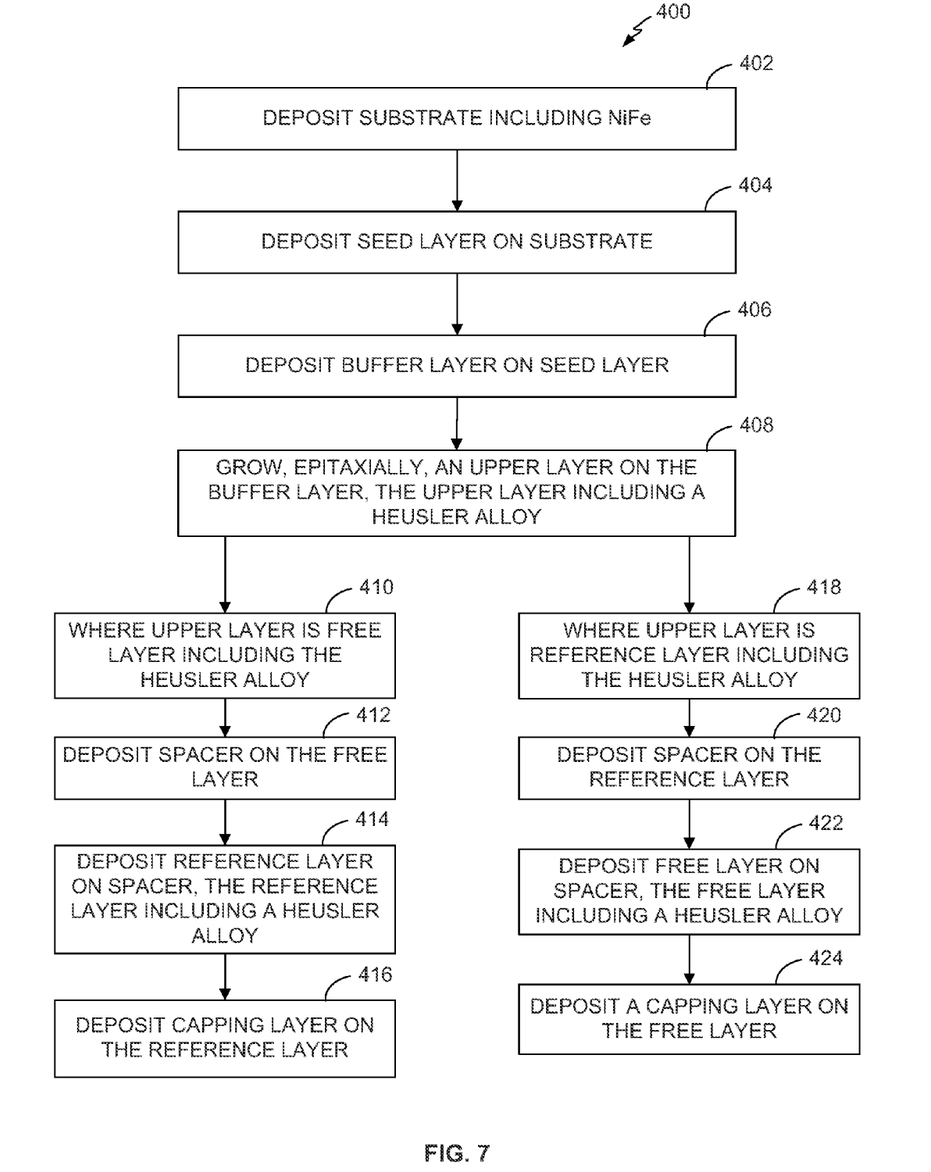
FIG. 7 is a flowchart of a process for forming a magnetic storage element with high magneto-resistance having seed and buffer layers on a NiFe substrate that are configured to support formation of one or more Heusler alloy layers in accordance with one embodiment of the invention.

FIG. 7 is a flowchart of a process 400 for forming a magnetic storage element with high magneto-resistance having seed and buffer layers on a NiFe substrate that are configured to support formation of one or more Heusler alloy layers in accordance with one embodiment of the invention. In particular embodiments, the process 400 can be used to form one or more of the magnetic storage elements of FIGS. 4-6. The process first deposits (402) a substrate including NiFe. In some embodiments, the substrate can be deposited on a shield. In other embodiments, the substrate can act as a shield. The process then deposits (404) a seed layer on the substrate. The process then deposits (406) a buffer layer on the seed layer. In several embodiments, the seed layer and buffer layer are configured to facilitate an epitaxial growth of a Heusler alloy about to be deposited. The process then grows (408), epitaxially, an upper layer on the buffer layer where the upper layer includes a Heusler alloy.

In some embodiments, the upper layer is (410) to be a free layer to form a top spin valve or pseudo spin valve configuration for the magnetic storage element. In such case, the process deposits (412) a spacer layer on the free layer. The process then deposits (414) a reference layer on the spacer layer where the reference layer includes a Heusler alloy. As described above, the reference layer may be a multi-layer structure. The process then deposits (416) a capping layer on the reference layer.

In some embodiments, the upper layer is (418) to be a reference layer to form a bottom spin valve configuration magnetic storage element. In such case, the process deposits (420) a spacer layer on the reference layer. The process then deposits (422) a free layer on the spacer layer where the free layer includes a Heusler alloy. The process then deposits (424) a capping layer on the free layer.

In one embodiment, the process can perform the sequence of actions in a different order. In another embodiment, the process can skip one or more of the actions. In other embodiments, one or more of the actions are performed simultaneously. In some embodiments, additional actions can be performed.

In several embodiments, the magnetic storage elements include multi-layer stacked structures with the particular layers depicted in FIGS. 4-6. In other embodiments, additional layers can be included or some of the layers may be omitted. In several embodiments, the additional layers may include one or more intervening layers positioned between the depicted layers. In a number of embodiments, one or more layers may be formed of a Heusler alloy grown epitaxially. In one such embodiment, the Heusler alloy can have be CFMS alloy and/or have a L21/B2 ordering.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

What is claimed is:

1. A method for manufacturing a magnetic storage element, the method comprising:
    depositing a substrate comprising NiFe;
    depositing a seed layer on the substrate;
    depositing a buffer layer on the seed layer; and
    growing, epitaxially, an upper layer on the buffer layer, the upper layer comprising a Heusler alloy.

2. The method of claim 1:
    wherein the substrate comprises a first crystalline structure; and
    wherein the seed layer is configured to substantially obstruct a transfer of the first crystalline structure to the buffer layer and the upper layer.

3. The method of claim 1:
    wherein the substrate comprises a first crystalline structure;
    wherein the seed layer is configured to substantially obstruct a transfer of the first crystalline structure to the buffer layer and the upper layer;
    wherein the seed layer is configured to provide a second crystalline structure different from the first crystalline structure;
    wherein the buffer layer is configured to substantially maintain the second crystalline structure; and
    wherein a structure of the buffer layer substantially matches a crystalline structure of the upper layer.

4. The method of claim 3, wherein the first crystalline structure comprises a face-centered cubic structure, and the second crystalline structure comprises a structure that is about body-centered cubic.

5. The method of claim 3:
    wherein the seed layer comprises a first magnetic sub-layer with an amorphous structure and a second magnetic sub-layer with the second crystalline structure that is about body-centered cubic; and
    wherein the second crystalline structure is developed through a process for changing the amorphous structure of the first magnetic sub-layer, the process selected from the group consisting of an annealing process, a phase change process, a re-crystallization process, and combinations thereof.

6. The method of claim 1:
    wherein the substrate comprises a first crystalline structure; and
    wherein the seed layer and the buffer layer are configured to provide a foundation structure for the Heusler alloy of the upper layer that is different from the first crystalline structure.

7. The method of claim 1:
    wherein the Heusler alloy comprises a L21/B2 ordering; and
    wherein the Heusler alloy comprises a CFMS alloy.

8. The method of claim 1:
    wherein the seed layer comprises substantially magnetic characteristics; and
    wherein the buffer layer comprises substantially non-magnetic characteristics.

9. The method of claim 1:
    wherein the upper layer comprises a free layer comprising the Heusler alloy; and
    wherein the method further comprises:
        depositing a spacer on the free layer;
        depositing a reference layer on the spacer, the reference layer comprising a Heusler alloy; and
        depositing a capping layer on the reference layer.

10. The method of claim 9:
    wherein the Heusler alloy of the free layer comprises a L21/B2 ordering;
    wherein the Heusler alloy of the reference layer comprises a L21/B2 ordering;
    wherein the depositing the capping layer on the reference layer comprises:
        depositing a non-magnetic coupling layer on the reference layer;
        depositing an anti-ferromagnetically coupled pinned layer on the non-magnetic coupling layer, wherein the reference layer is anti-ferromagnetically coupled via the non-magnetic coupling layer;
        depositing an anti-ferromagnetic pinning layer on the anti-ferromagnetically coupled pinned layer; and
        depositing the capping layer on the anti-ferromagnetic pinning layer; and wherein the depositing the reference layer on the spacer comprises growing, epitaxially, the Heusler alloy of the reference layer.

11. The method of claim 1:
wherein the upper layer comprises a reference layer, the reference layer comprising the Heusler alloy; and
wherein the method further comprises:
depositing a spacer on the reference layer;
depositing a free layer on the spacer, the free layer comprising a Heusler alloy; and
depositing a capping layer on the free layer.

12. The method of claim 11:
wherein the Heusler alloy of the reference layer comprises a L21/B2 ordering;
wherein the Heusler alloy of the free layer comprises a L21/B2 ordering; and
wherein the depositing the free layer on the spacer comprises growing, epitaxially, the Heusler alloy of the free layer.

13. The method of claim 1:
wherein the seed layer comprises a multi-layer structure with one or more materials selected from the group consisting of NiFe, Ta, Ti, amorphous CoFeB, CoFe, a material comprising a magnetic CFMS Heusler alloy, and combinations thereof; and
wherein the buffer layer comprises one or more materials selected from the group consisting of Ta, Ti, Cr, Ru, Cu, Ag, Al, W, a Ta alloy, a Cr alloy, a Ru alloy, a Cu alloy, a Ag alloy, a W alloy, a NiAl alloy, and combinations thereof.

14. The method of claim 1:
wherein the seed layer comprises a multi-layer structure with one or more materials selected from the group consisting of NiFe, Ta, Ti, amorphous CoFeB, CoFe, a material comprising a magnetic CFMS Heusler alloy, and combinations thereof; and
wherein the buffer layer comprises one or more materials selected from the group consisting of Cu2CrAl, Cu2AlSi, a material comprising a non-magnetic Heusler alloy, and combinations thereof.

15. The method of claim 1:
wherein the magnetic storage element is a current perpendicular to plane giant magneto-resistance (GMR) reader;
wherein a shield layer is selected from the group consisting of the substrate, the seed layer, and combinations thereof; and
wherein the shield layer acts as a shield for the GMR reader.

* * * * *